(12) United States Patent
Gabara

(10) Patent No.: US 6,552,581 B1
(45) Date of Patent: Apr. 22, 2003

(54) CURRENT RECYCLING CIRCUIT AND A METHOD OF CURRENT RECYCLING

(75) Inventor: Thaddeus John Gabara, Murray Hill, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/648,162

(22) Filed: Aug. 25, 2000

(51) Int. Cl.[7] .......................................... H03K 19/0175
(52) U.S. Cl. ........................ 327/108; 327/595; 307/36; 307/77
(58) Field of Search ................................ 327/215, 108, 327/185, 544, 595, 519; 330/251; 307/36, 37, 54, 61, 63, 71, 77

(56) References Cited

U.S. PATENT DOCUMENTS

| | | | | |
|---|---|---|---|---|
| 5,032,745 A | * | 7/1991 | Izadinia et al. ............. | 327/424 |
| 5,130,580 A | * | 7/1992 | Min et al. .................... | 326/119 |
| 5,202,618 A | * | 4/1993 | Nishimura ................... | 307/36 |
| 5,574,344 A | * | 11/1996 | Matsuoka et al. .......... | 318/293 |
| 5,708,389 A | * | 1/1998 | Gabara ........................ | 327/552 |
| 5,734,272 A | * | 3/1998 | Belot et al. ................. | 326/126 |
| 5,867,057 A | * | 2/1999 | Hsu et al. .................... | 327/544 |
| 5,909,128 A | | 6/1999 | Maeda | |
| 5,977,796 A | | 11/1999 | Gabara | |
| 6,154,044 A | * | 11/2000 | Herr ........................... | 326/104 |

FOREIGN PATENT DOCUMENTS

JP 58210722 8/1983

* cited by examiner

*Primary Examiner*—Timothy P. Callahan
*Assistant Examiner*—Terry L. Englund

(57) ABSTRACT

A process and circuitry for drawing current from a power source to produce a first operation, such as a Boolean operation, and reusing the current to generate a further operation. In other words, the current from the first operation may be used to perform a second or subsequent operation. This process is referred generally herein as current recycling.

19 Claims, 4 Drawing Sheets

US 6,552,581 B1

CURRENT RECYCLING CIRCUIT AND A METHOD OF CURRENT RECYCLING

FIELD OF THE INVENTION

The present invention relates to the field of circuits and, more particularly, to a method and apparatus for current recycling for circuits.

BACKGROUND OF THE INVENTION

Current steering is gaining high visibility as a vehicle for high speed data transfer. The constant need to transfer more information faster, accompanied by increases in data processing capability has necessitated an expansion to data transfer rates considerably higher than what was previously possible. One data transmission scheme used to accomplish these higher rates is differential data transmission in which the difference in voltage levels between two signal lines form the transmitted signal. Differential data transmission is commonly used for data transmission rates greater than 100 Mbps and over long distances. Noise signals in the differential transmission shift the ground level voltage and appear as common mode voltages. Thus, the deleterious effects of noise are substantially reduced.

An example of a conventional low voltage differential swing (LVDS) driver circuit 800 used for differential data transmission is shown in FIG. 10. The difference in voltage between the output signals OUT+, OUT− on the output terminals 803, 805 form a pair of differential signals. A pair of differential signals, means two signals whose current waveforms are out of phase with one another. The individual signals of a pair of differential signals are indicated by reference symbols respectively ending with "+" and "−" notation (e.g., S+and S−). The composite notation "+/−" is employed to indicate both differential signals using a single reference symbol, e.g., S+/−.

The LVDS driver circuit 800 includes a direct current (DC) constant current source I1 coupled to voltage supply VDD, four n-channel metal oxide semiconductor (NMOS) switches M11–M14, and a resistor R1 coupled between the common node COM and voltage supply VSS. The four transistor switches M11–M14 are controlled by input voltage signals VIN1, VIN2 and direct current through load resistor Rt as indicated by arrows A and B. The input voltage signals VIN1, VIN2 are typically rail-to-rail voltage swings. The gates of NMOS switches M11 and M14 couple together to receive input voltage signal VIN1. Similarly, the gates of NMOS switches M12 and M13 couple together to receive input voltage signal VIN2.

Operation of the LVDS driver circuit 800 is explained as follows. Two of the four NMOS switches M1–M14 turn on at a time to steer current from current source I1 to generate a voltage across resistive load Rt. To steer current through resistive load Rt in the direction indicated by arrow B, input signal VIN2 goes high turning ON NMOS switches M12 and M13. When input signal VIN2 goes high, input signal VIN1 goes low to keep NMOS switches M11 and M14 OFF during the time NMOS switches M12 and M13 are ON. Conversely, to steer current through resistive load Rt in the direction indicated by arrow A, input signal VIN1 goes high and is applied to transistor switches M11 and M14 to make them conduct. Input signal VIN2 goes low to keep NMOS switches M12 and M13 OFF during this time. As a result, a full differential output voltage swing can be achieved.

In other words, the prior differential LVDS driver circuit 800 sources current from VDD and sinks this current to VSS. In between, a switching array controlled by a Boolean signal routes the source current through the interconnect to an external resistive load. The return current is routed back to the array and sunk to VSS. The polarity of the voltage drop across the resistor carries the digital value. Changing the polarity of the array causes the current to route through the interconnect and resistor in the opposite direction and transfer the other digital value.

In addition to the requirement for transferring data at greater speeds, there is continuous pressure to reduce the amount of power consumed by integrated circuits. The differential LVDS offers reduced power consumption as compared with other drivers. The disadvantage is the need to have a set of interconnects for each signal because a differential LVDS driver is provided for each of the interconnects. It is this need to have a set of interconnects for each signal that drives the power of an integrated circuit using differential LVDS driver circuits. Thus, it would be desirable to provide a means to implement the differential LVDS driver circuits at a lower power.

SUMMARY OF THE INVENTION

The present invention is directed to a process and circuitry for drawing current from a power source to produce a first operation, such as a Boolean operation, and reusing the current to generate a further operation. In other words, the current from the first operation may be used to perform a second or subsequent operation instead of sinking the current to ground or another power source. This process is referred generally herein as current recycling.

BRIEF DESCRIPTION OF THE DRAWINGS

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

Briefly, the present invention provides a process for drawing current from a power source to produce a first operation, such as a Boolean operation, and reusing the current to generate further operations. In other words, the current from the first operation may be used to perform a second or subsequent operation.

Figure 1:
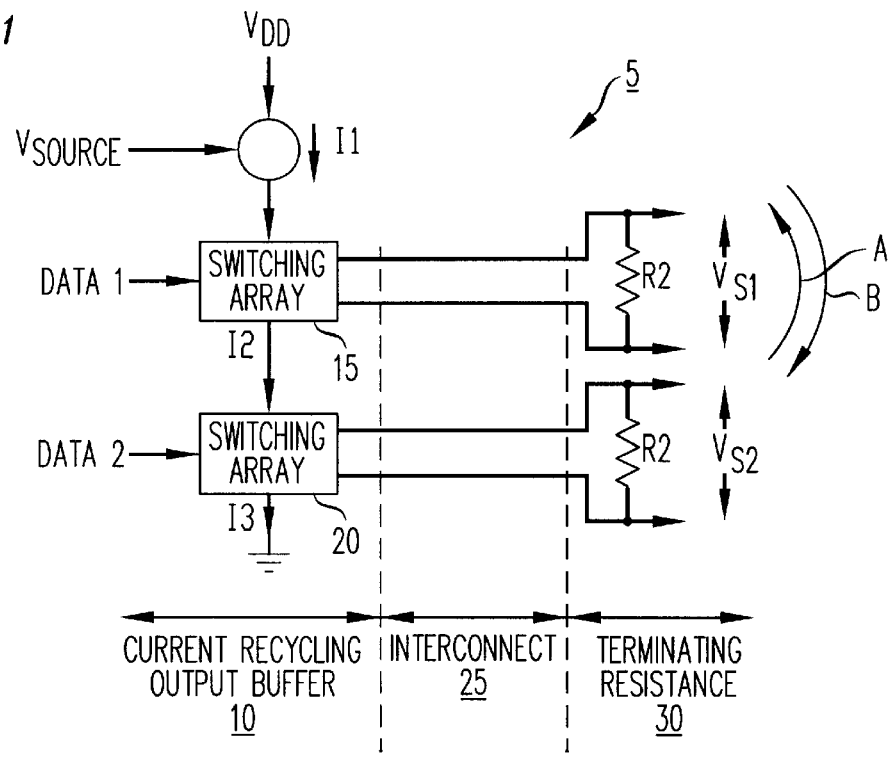
FIG. 1 is a block diagram of a line driver according to an illustrative embodiment of the present invention.

FIG. 1 is a block diagram of a line driver 5 useful for illustrating an exemplary embodiment of the present invention. The line driver 5 includes current recycling output buffer 10 that has at least a first switching array 15 and a second switching array 20. The current recycling buffer 10 is electrically coupled to an interconnect section 25 which is in turn electrically coupled to a load that forms a terminating resistance 30.

The switching arrays 15, 20 are arranged so that the current I1 being supplied from the supply Vdd is applied to the first switching array 15. The first switching array 15 routes the current to the terminating resistance and back transferring a first Boolean operation, shown as $V_{s1}$, across the load R1. The current I2 is applied to the second switching array 20 so that the second switching array 20 can perform a second Boolean operation, shown as $V_{s2}$, across load R2. The current I3 is returned to ground Gnd. The currents I1, I2, and I3 are the same or substantially the same.

Figure 10:
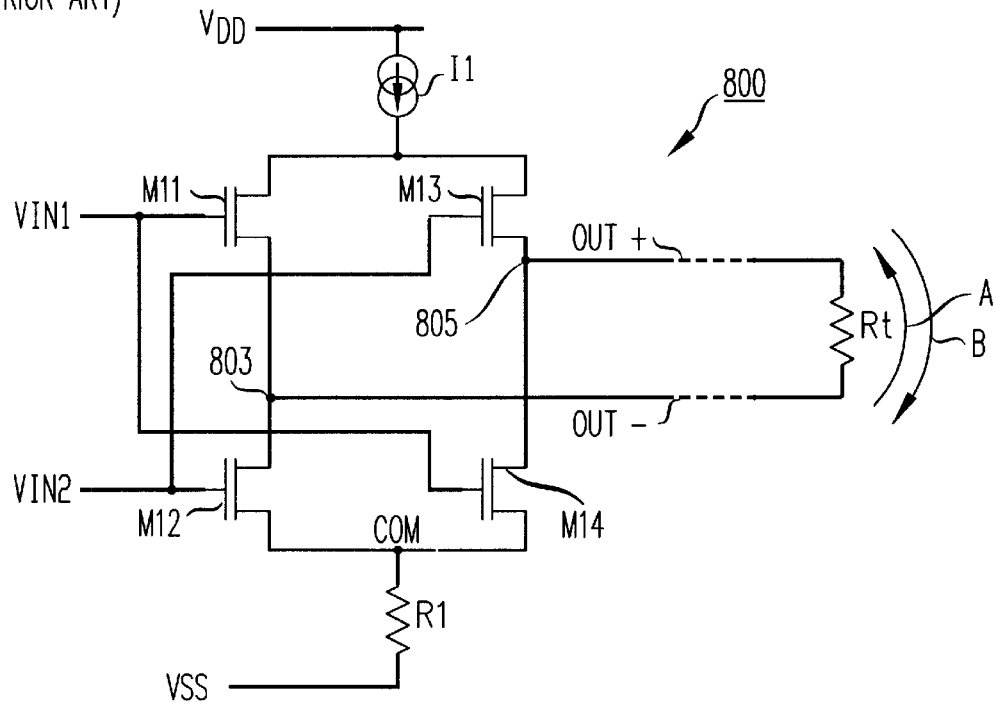
FIG. 10 is a conventional low voltage differential swing (LVDS) driver circuit.

The advantage of this technique is that the same current drawn from Vdd is used repeatedly, or recycled, to perform several operations (e.g., Boolean operations). For example, for the a conventional LVDS buffer as is shown in FIG. 10, the power dissipation per Boolean transfer is shown in equation (1).

$$P=IV \qquad (1)$$

For the line driver circuitry 5 shown in FIG. 1 and according to the present invention, however, the power dissipation P is shared among N Boolean transfers where N is, for example, the number of switching arrays. Thus, the power dissipation for each Boolean transfer $P_B$ is defined in Equation (2).

$$P_B=IV/N \qquad (2)$$

Thus, the power saving is inversely proportional to the number of switching arrays that are coupled between the power source Vdd and ground Gnd. In other words, the power consumption may be reduced by a factor of N.

In addition to the power savings that may be realized, the transmission line may be used as a current source because transmission lines can store/release a uniform amount of energy. The release of this stored energy is usually in the form of a propagating wave. The characteristics of this wave are a constant current of $V_s/Z_o$, where $Z_o$ is the characteristic impedance of the line. The current source I1 in FIG. 1 is used to charge/discharge the transmission lines uniformly. This causes the transmission line to behave as a current source. Thus, the transmission lines regulate the current flow as well. In essence, they behave as a distributed current source.

A conventional LVDS generates a voltage swing at constant common mode voltage value of, for example, 1.2 V. This makes the extraction of the signal at the receiver easier since the common mode voltage of the input signal is a constant. However, in the current recycling method shown in the illustrative embodiment, the common mode voltages of the signals in FIG. 1 have the relation shown in (3).

$$AVG(V_{s1})>AVG(V_{s2}) \qquad (3)$$

The receiver extracting this signal operates to extract the signal regardless of the common mode voltage. In other words, the receiver extracts the signal over a wide common mode voltage range. Circuits to perform this function exist and are shown in, for example, U.S. Pat. No. 5,708,389 entitled INTEGRATED CIRCUIT EMPLOYING QUANTIZED FEEDBACK and issued on Jan. 13, 1998. This patent is incorporated in its entirety herein by reference.

Figure 2:
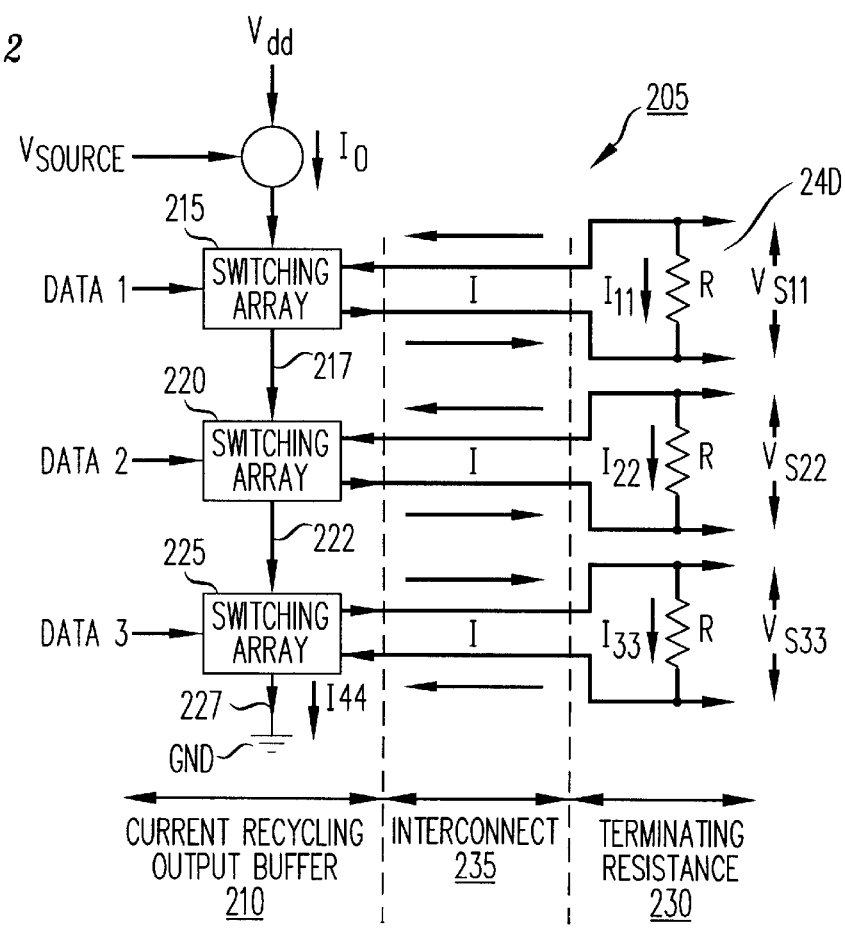
FIG. 2 is a block diagram of a line driver according to another illustrative embodiment of the present invention.

FIG. 2 is a block diagram of a line driver according to another illustrative embodiment of the present invention. The line driver 205 includes current recycling output buffer 210 that has at least a first switching array 215, a second switching array 220, and a third switching array 225. The current recycling buffer 210 is electrical coupled to a load that forms a terminating resistance 230 via interconnects 235.

The switching arrays 215, 220, 225 are arranged so that the current $I_0$ being supplied from the supply Vdd is applied to the first switching array 215. The first switching array 215 routes the current $I_{11}$ to the load 240 and back, transferring a first Boolean operation, shown as $V_{s11}$, across the load 240. In other words, a voltage $V_{s11}$ is generated in response to the current $I_{11}$ passing through the load 240. The current is applied to the second switching array 220 via line 217 so that the second switching 220 array can perform a second Boolean operation represented by voltage $V_{s22}$. The rerouted current from this process is provided to the third switching array 225 via line 222 to generate a third Boolean operation represented by voltage $V_{s33}$. The current is then returned to ground Gnd via line 227. In other words, the circuitry of FIG. 2 operates to pass the current from stage to stage so that the current from a previous stage powers a subsequent stage.

Figure 5:
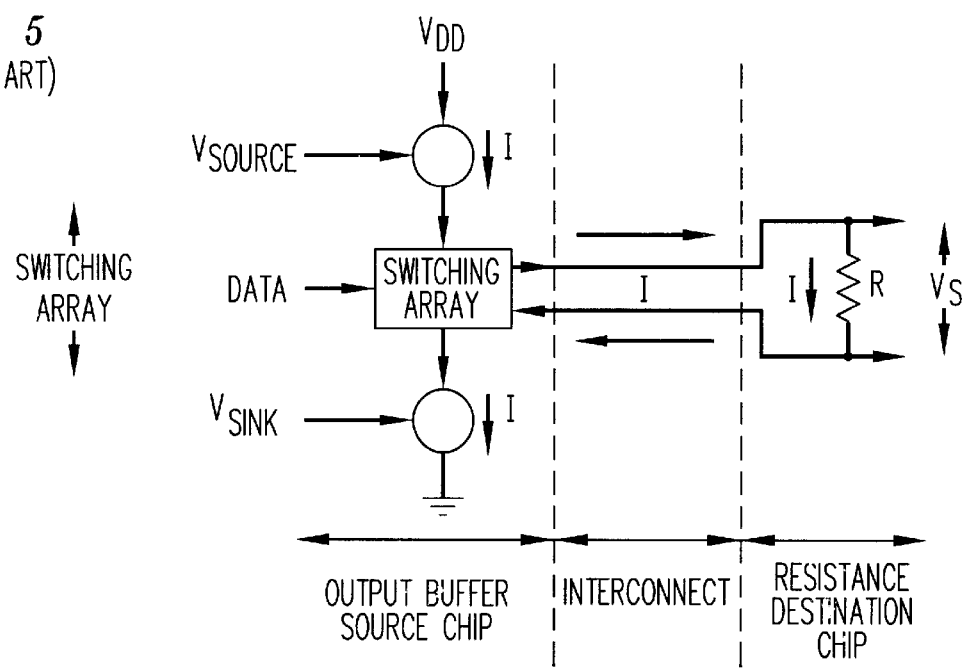
FIG. 5 is a circuit diagram of a conventional line driver.

To illustrate the potential power savings, consider FIG. 5 which illustrates a conventional differential LVDS driver where the typical swing of $V_s$ is 300 mV and Vdd is 2.5V. Thus, the voltage swing is about ⅛ that of the power supply. In other words, one Boolean operation occurs using ⅛ of the supply voltage drop. The remaining ⅞ of the supply is dropped in the active circuit comprising the buffer. This includes the devices in the switching array and the current sources. The voltage drop loss of ⅞ Vdd is effectively a loss of energy that heats up the integrated circuit. The available energy that is currently wasted can be used more effectively using the present invention. The basic premise is to obtain additional functionality such as additional Boolean functions from energy that would be otherwise wasted.

For example, the illustrative embodiment shown in FIG. 2 produces three Boolean operations (an additional two operations) using approximately the same power as the prior systems use to perform one Boolean operation. The number of Boolean operations that can be performed is dependent upon the particular circuit design. The inventor has recognized, however, the remaining energy from one operation may be used to generate subsequent operations.

Figure 3:
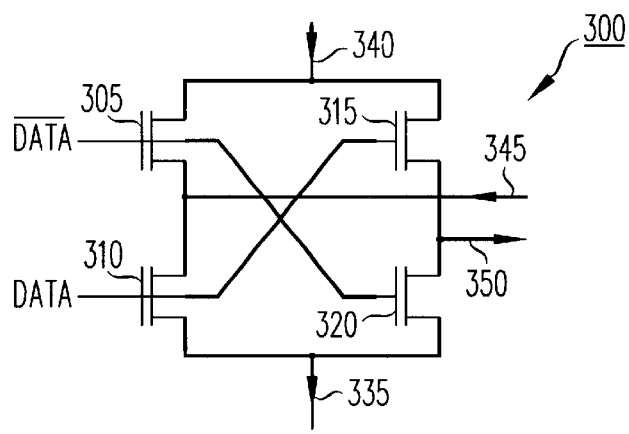
FIG. 3 is an illustrative circuit diagram of a switching array suitable for use in the line drivers shown in FIGS. 1 and 2.

The switching arrays 15, 20, 215, 220, and 225 may be implemented in a number of forms. FIG. 3 illustrates one embodiment for implementing a switching array. The switching array 300 of FIG. 3 includes n-channel transistors 305, 310, 315, 320. In operation, transistors 310 and 315 are enabled when the data signal DATA is high. The transistor 310 routes current from the upper line 345 to line 335 while transistor 315 routes current on the lower line 350 to exit the switching array 300. The current provided via line 335 is provided to ground or a subsequent switching array. The current flow is reversed when the data signal is low. Line 335 may correspond to lines 217, 222, or 227 in FIG. 2. In addition, data lines data and data collectively correspond to data lines data1, data2, or data3. Current is provided to the switching array via line 340 from the supply or a previous switching array or stage.

For this circuit, the data signals provide sufficient gate to source voltage to insure the devices behave as switches. Thus, the source voltage of the transistors 305, 310, 315, 320 should be less than the gate voltage. This may cause a limitation on the allowable voltage range developed across the load resistance. For instance, assume that in FIG. 2 the input data data1, data2, and data3 swing between the voltage Vdd and the voltage Vss. Because the average of each of the voltages Vs11, Vs22, and Vs33 has the relationship Avg(Vs11)>Avg(Vs22)>Avg(Vs33), the switching array 215 would have a smaller voltage applied to the transistors that form the array assuming that the arrays are formed using N-channel devices. Turning to FIG. 3, we see that the transistors 310 and 315 would then have a smaller gate to source voltage applied.

Figure 4:
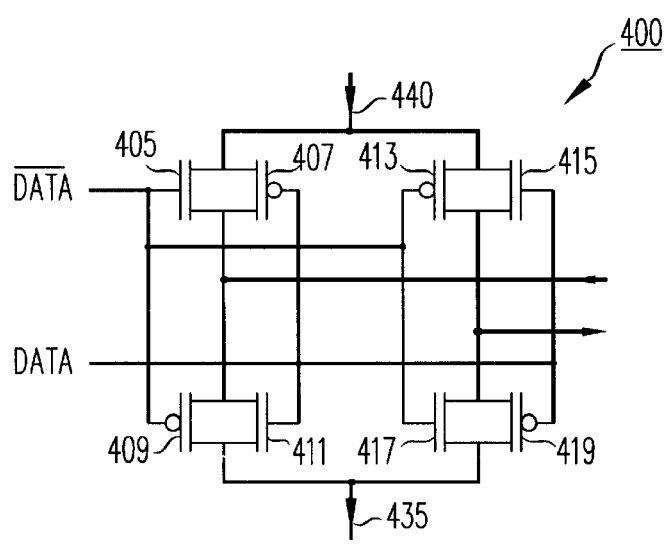
FIG. 4 is an illustrative circuit diagram of another switching array suitable for use in the line drivers shown in FIGS. 1 and 2.

FIG. 4 illustrates an alternative switching array that addresses this issue. In FIG. 4, transmission gates 405, 407, 409, 411, 413, 415, 417, and 419 are utilized. Now the switching array 400 can be enabled independent of the voltage range developed across the load resistance. This occurs because parallel N and P-channel transistors are used and which enable the conductive path of the switching array. When one device of the parallel pair is not turned on well, the other device of the parallel pair may be more enabled. If the polarity of the data signal is reversed, the switching array is reconfigured to allow a reversal of current flow through the load. Current is supplied to the array via line 440 and current is supplied from the switching array via line 435.

The circuits shown in FIGS. 3 and 4 are illustrative current steering switching arrays. Alternative switching circuits arrangements may be employed. In this case, however, the circuitry is modified to use current recycling. Further, the circuitry and the operation of the circuitry shown in FIGS. 3 and 4 is conventional except for the recognition that current may be received from a previous stage or provided to a subsequent stage. In other words, a first circuit performing a first functionality provides current to enable a second circuit to perform a second function or operation. The first circuit and the second circuit may perform the same function such as the line drivers shown in FIGS. 2 or 3, or different functions as is described below.

Figure 9:
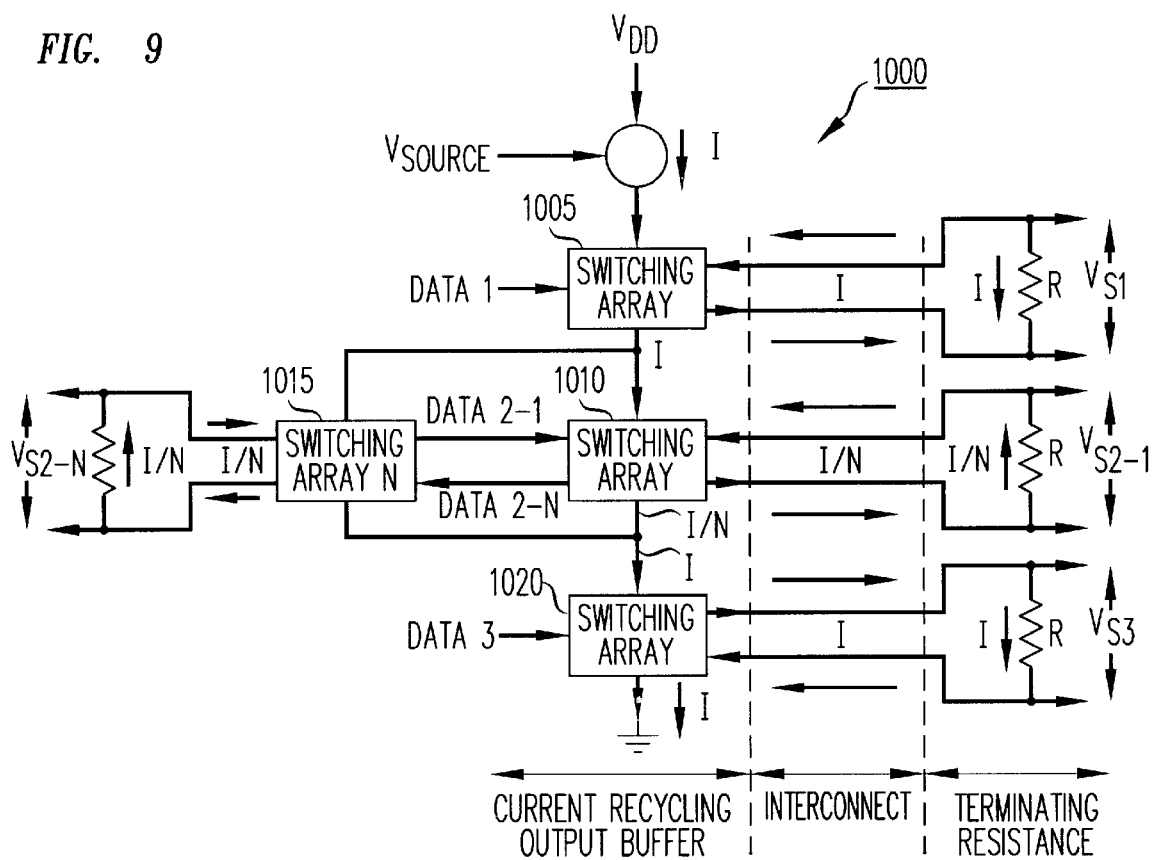
FIG. 9 is a block diagram of a line driver according to a further illustrative embodiment of the present invention.

Another illustrative embodiment is shown in FIG. 9. The current from the top array 1005 is split and applied to N arrays 1010 and 1015, each performing a function such as driving a line as described above with regard to FIGS. 1 and 2. Although only two of the N switching arrays are shown, there may be more than two switching arrays. The recycled current I/N from all N arrays is then combined and applied to the array 1020. This embodiment can allow up to N×H operations per current path, where N is number of horizontal partitions (e.g. the arrays 1010 and 1015) and H is the number of vertical partitions. One disadvantage of this embodiment is that the voltage swing $V_{s2-1}$ and $V_{s2-N}$ decreases causing the noise immunity to degrade. This embodiment operates and employs the same current recycling principles described above with regard to the other embodiments such as those shown in FIGS. 1 and 2. Further, the switching arrays may be switching arrays as described herein.

Figure 6:
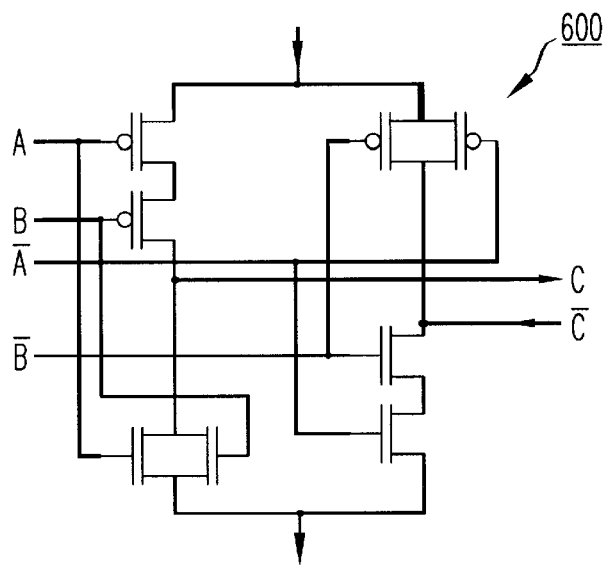
FIG. 6 is a circuit diagram of a NOR circuit according to an illustrative embodiment of the present invention.
Figure 7:
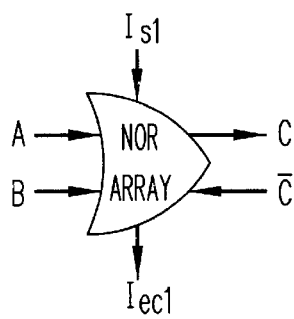
FIG. 7 is a block diagram of the circuitry shown in FIG. 6.

In addition to the current steering circuits shown in FIGS. 1 and 2, more complex logic can be embedded into the switching array without significantly impacting the power needs of the switching array. This is accomplished by current recycling. FIG. 6 illustrates a NOR switching array 600 that employs current recycling according to an exemplary embodiment of the present invention. The corresponding block representation of the array is shown in FIG. 7. In this embodiment, current Is1 provided from circuitry such as is shown in FIGS. 3 and 4 or another NOR switching array or a current source may be utilized to drive the desired outputs C and $\overline{C}$ in response to the inputs A, $\overline{A}$, B, or $\overline{B}$.

Figure 8:
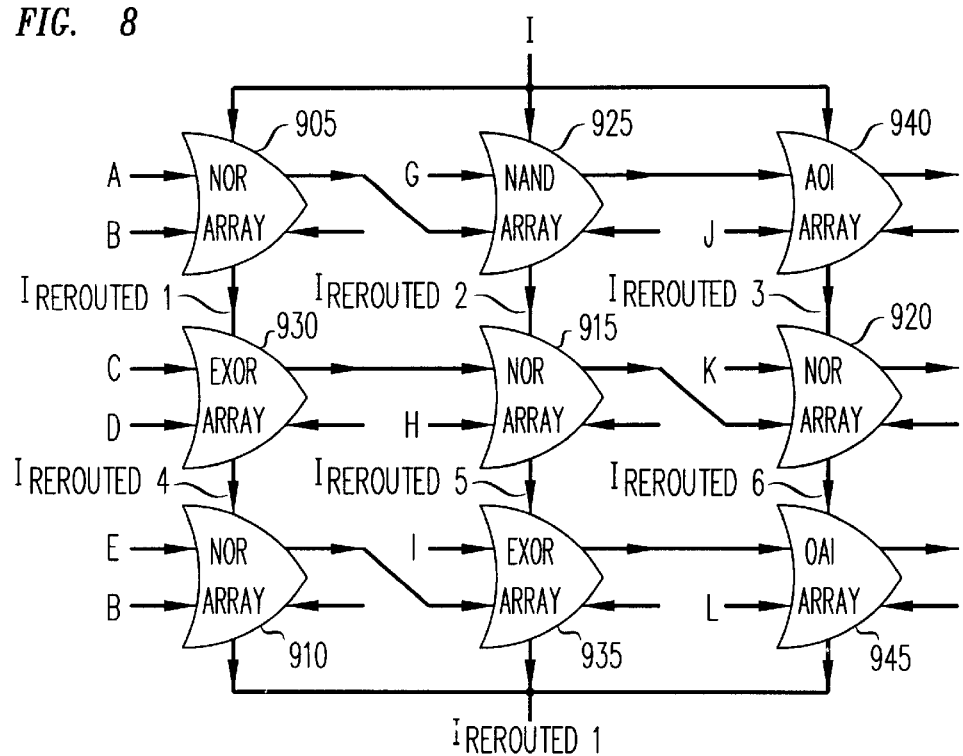
FIG. 8 is a Boolean low noise logic block employing current recycling according to an illustrative embodiment of the present invention.

One implementation using the NOR switching array employing current recycling is shown in FIG. 8. FIG. 8 is a block diagram illustrating a low noise logic block using current recycling. The low noise logic block is a three tier Boolean circuit. Signals from the same tier can be sent to any logic gate in the same tier. An impedance (not shown) is placed at the output of each gate to insure a continuous circuit. Signals sent between tiers may be level shifted to account for a voltage shift between arrays. The NAND array 925, the NOR array 905, and the AOI array 940 receive current I from a current source or current from a previous circuit stage such as a line diver. The rerouted current $I_{reroutedx}$ from each array 905, 930, 925, 915, 940, 920 are provided to a respective subsequent array. The rerouted current $I_{rerouted7}$ from arrays 910, 935, 945 is provided to other circuitry or to ground.

The NOR arrays 905, 910, 915, and 920 may be formed using the circuitry shown in FIG. 6. The circuitry shown in FIG. 6 may also be used to form NAND array 925. In this case circuitry is provided to reverse the polarity of the inputs to the array making the circuitry perform as a NAND gate. The remaining components including the Exclusive OR (EXOR) arrays 930 and 935, the AND-OR-INVERT (AOI) array 940, and OR-AND-INVERT (OAI) array 945 each may be formed using conventional circuitry except that the circuits are modified to receive current from another circuit or provide current to another circuit according to the present invention. Inputs A through L represent digital inputs into the NOR switching array.

By using current recycling, additional circuitry may be added to, for example, the line drivers without increasing or without significantly increasing the power consumption of the driver. In this way, complex functions may be included in the line drivers. Further, this may potentially lower the propagation delay of the cell.

Although the invention has been described with reference to exemplary embodiments, it is not limited to those embodiments. For example, although the illustrative embodiments show two and three switching arrays, there may be more than three switching arrays. In addition, different combinations of circuitry may be combined together using the present invention.

For example, an output buffer may include a line driver and some other circuitry for performing some function. According to the present invention, the line driver and the other circuitry would be interconnected so that current from the line driver may be provided to the other circuitry or the current from the other circuitry may be provided to the line driver. In either case, the present invention provides circuitry that performs one operation and passes current to other circuitry so that it can perform another operation. Therefore, the invention should not be limited to the specific circuits shown herein. Further, the appended claims should be construed to include other variants and embodiments of the invention, which may be made by those skilled in the art without departing from the true spirit and scope of the present invention.

What is claimed is:

1. A circuit comprising:
   a first current steering stage;
   at least a second current steering stage;
   the first current steering stage, comprising a low voltage differential swing circuit, using a first current to drive a first output in respect to a first input; and the second current steering stage, using a second current from the first current steering stage, configured to drive a second output in respect to a second input.

2. The circuit of claim 1 wherein the second current steering stage comprises a further low voltage differential swing circuit.

3. The circuit of claim 1 wherein the first current steering stage operates at a first common mode voltage and the second current steering stage operates at a second common mode voltage different than the first common mode voltage.

4. The circuit of claim 3 wherein the first common mode voltage is greater than the second common mode voltage.

5. The circuit of claim 1 wherein the second current steering stage comprises at least two current steering stages each receiving a portion of the second current.

6. A circuit comprising:
   a first circuit, including a first current steering stage comprising a low voltage differential swing circuit, adapted to receive a first supply current; and
   a second circuit adapted to receive a second supply current only from the first circuit;
   the first circuit adapted to produce a first output in response to a first input and the second circuit adapted to produce a second output in response to a second input.

7. The circuit of claim 6 wherein the second circuit is adapted to receive a portion of the first supply current.

8. The circuit of claim 7 wherein the first circuit is a first line driver.

9. The circuit of claim 8 wherein the second circuit is a second line driver.

10. The circuit of claim 8 wherein the second circuit is other than a line driver.

11. The circuit of claim 6 wherein the second circuit is a line driver.

12. The circuit of claim 6 wherein the second circuit comprises at least two separate circuits each receiving a portion of the second supply current.

13. A process for operating circuitry comprising
   (a) providing a current to a first circuit including a first current steering stage comprising a low voltage differential swing circuit;
   (b) using, by the first circuit, the current for providing a first output in respect to a first input;
   (c) providing the current to a second circuit different from the first circuit; and
   (d) using, by the second circuit, the current for providing a second output in respect to a second input.

14. The process of claim 13 wherein step (b) is performed prior to step (d).

15. The process of claim 14 wherein the first circuit is a line driver.

16. The process of claim 15 wherein the second circuit is a further line driver.

17. The process of claim 15 wherein the second circuit performs a Boolean operation.

18. The process of claim 13 wherein the second circuit is a line driver.

19. The process of claim 13 wherein the second circuit comprises at least two separate circuits where step (d) further comprises:
   using, by the at least two separate circuits, a portion of the current.

* * * * *